United States Patent
Miro Panades

(10) Patent No.: US 11,146,278 B2
(45) Date of Patent: Oct. 12, 2021

(54) FREQUENCY LOCKED LOOP WITH FAST REACTION TIME

(71) Applicant: Commissariat à l'Energie Atomique et aux Energies Alternatives, Paris (FR)

(72) Inventor: Ivan Miro Panades, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/201,244

(22) Filed: Nov. 27, 2018

(65) Prior Publication Data
US 2019/0165797 A1    May 30, 2019

(30) Foreign Application Priority Data
Nov. 28, 2017  (FR) ..................... 1761288

(51) Int. Cl.
| H03L 7/099 | (2006.01) |
| H03L 7/181 | (2006.01) |
| H03L 7/08 | (2006.01) |
| H03K 21/38 | (2006.01) |

(52) U.S. Cl.
CPC ........... *H03L 7/0992* (2013.01); *H03K 21/38* (2013.01); *H03L 7/181* (2013.01); *H03L 7/0802* (2013.01); *H03L 2207/50* (2013.01)

(58) Field of Classification Search
CPC ...... H03L 7/0992; H03L 7/0802; H03K 21/38
See application file for complete search history.

(56) References Cited

U.S. PATENT DOCUMENTS

| 4,704,585 A | 11/1987 | Lind |
| 5,182,528 A | 1/1993 | Zuta |
| 5,459,435 A | 10/1995 | Taki |
| 10,263,626 B2 * | 4/2019 | Wang ..................... H03L 7/099 |
| 2005/0080579 A1 | 4/2005 | Cahill-O'Brien et al. |
| 2009/0316847 A1 | 12/2009 | Thomsen |

OTHER PUBLICATIONS

Preliminary Search Report for French Application No. 1761288 dated Aug. 9, 2018, 2 pages.
C. Albea et al., "Architecture and Robust Control of a Digital Frequency-Locked Loop for Fine-Grain Dynamic Voltage and Frequency Scaling in Globally Asynchronous Locally Synchronous Structures," J. Low Power Electronics 2011, vol. 7, No. 3, pp. 1-13.

* cited by examiner

*Primary Examiner* — Lincoln D Donovan
*Assistant Examiner* — Colleen J O Toole
(74) *Attorney, Agent, or Firm* — Moreno IP Law LLC

(57) ABSTRACT

The invention concerns a frequency locked loop comprising: a digitally controlled oscillator (102) configured to generate a frequency signal (F); a frequency counter (310) configured to generate an estimate (f_EST) of the frequency of the frequency signal based on a reference clock signal (CLK_REF); and a controller (314) configured to generate a digital control signal (C_FREQ) for controlling the digitally controlled oscillator based on the estimated frequency, wherein the controller is clocked by a further clock signal (CLK) having a variable frequency, and the controller is configured to generate a trigger signal (AUTO_CLEAR) for triggering a counting phase of the frequency counter.

13 Claims, 4 Drawing Sheets

FREQUENCY LOCKED LOOP WITH FAST REACTION TIME

FIELD

The present disclosure relates to the field of frequency locked loops, and in particular to a circuit and method for providing a frequency locked loop having a fast reaction time.

BACKGROUND

Frequency locked loops (FLLs) based on a "Backward Euler" feedback loop are known in the art. Such FLLs involve the use of a digitally controlled oscillator (DCO) that generates a frequency signal based on a control signal. The feedback loop includes a frequency counter. During a counting phase, the frequency counter estimates the frequency of the generated frequency signal based on a reference clock signal. During a computing phase, a control circuit then adjusts the control signal provided to the DCO based on an error signal equal to the difference between the estimated frequency and a target frequency. The iteration period between each adjustment of the DCO is thus equal to the combined durations of the counting and computing phases.

It has been proposed to vary certain parameters of a digital circuit in order to improve power consumption and/or processing speed based on desired performance for a given operating mode. For example, if a period of high processing speed is required, the clock frequency and/or supply voltage of the circuit may be increased. Alternatively, if a period of low power consumption is required, the clock frequency may be reduced, allowing a corresponding reduction in the supply voltage while maintaining correct operation of the circuit.

A difficulty is that, in digital circuits permitting modification to the clock frequency and/or supply voltage and comprising an FLL, the iteration time of the FLL must generally be significantly increased in order to accommodate the permitted variations of the supply voltage and/or clock frequency. Such an increase in the iteration time leads to an increased response time of the FLL, in other words an increase in the time delay required, after initialization of the FLL, for the frequency signal to reach the target level.

SUMMARY

It is an aim of embodiments of the present description to at least partially address one or more difficulties in the prior art.

According to one aspect, there is provided a frequency locked loop comprising: a digitally controlled oscillator configured to generate a frequency signal; a frequency counter and sequencer circuit configured to generate an estimate of the frequency of the frequency signal based on a reference clock signal, for example by counting periods of the frequency signal during a counting phase having a start and an end timed by corresponding transitions of the reference clock signal, the frequency counter and sequencer circuit for example being further configured to have a computing phase during which periods of the frequency signal are not counted; and a controller configured to generate a digital control signal for controlling the digitally controlled oscillator based on the estimated frequency, the controller being clocked by a further clock signal having a variable frequency, and the controller being configured to generate a trigger signal for triggering, for example after resynchronization of the trigger signal with the reference clock signal, the end of the computing phase and/or the start of the counting phase of the frequency counter.

According to one embodiment, the frequency counter and sequencer circuit further comprises a resynchronization circuit configured to synchronize the trigger signal with the reference clock signal.

According to one embodiment, the resynchronization circuit comprises first and second flip-flops each clocked by the reference clock signal, the first flip-flop receiving the trigger signal, and the second flip-flop outputting a resynchronized trigger signal.

According to one embodiment, the frequency locked loop further comprises a sequencer configured to generate a state control signal for controlling the timing of the counting and computing phases, the sequencer being configured to transmit the state control signal to the controller to indicate when the estimate is available.

According to one embodiment, the controller is further configured to generate a further control signal for resetting the frequency counter.

According to one embodiment, the frequency locked loop further comprises a subtractor configured to generate an error signal by determining the difference between the estimated frequency and a target frequency.

According to one embodiment, the digitally controlled oscillator comprises a digital to analog converter and a voltage controlled oscillator.

According to one embodiment, the further clock signal has a variable frequency that can be set to any of a plurality of frequency values.

According to one embodiment, the trigger signal is asserted at a fixed time interval with respect to a transition of the digital control signal.

According to one embodiment, the fixed time interval is equal to a time delay of one or more clock periods for at least partially compensating for a time delay of the digitally controlled oscillator.

According to a further aspect, there is provided a device comprising the above frequency locked loop; and a system controller configured to control the frequency of the frequency signal, wherein the system controller and the controller are both clocked by said further clock signal.

According to one embodiment, the further clock signal is equal to or derived from said frequency signal.

According to a further aspect, there is provided a method of generating a frequency signal using a frequency locked loop, the method comprising: generating a frequency signal using a digitally controlled oscillator; generating, by a frequency counter during a counting phase, an estimate of the frequency of the frequency signal based on a reference clock signal, for example by counting periods of the frequency signal during a counting phase having a start and an end timed by corresponding transitions of the reference clock signal, the frequency counter and sequencer circuit for example being further configured to have a computing phase during which periods of the frequency signal are not counted; generating, by a controller, a digital control signal for controlling the digitally controlled oscillator based on the estimated frequency, the controller being clocked by a further clock signal having a variable frequency; and generating, by the controller, a trigger signal for triggering, after resynchronization of the trigger signal with the reference clock signal, the end of the computing phase and/or the start of the counting phase of the frequency counter.

According to one embodiment, the method further comprises synchronizing, by a resynchronization circuit of the frequency counter, the trigger signal with the reference clock signal.

According to one embodiment, the method further comprises: generating, by a sequencer, a state control signal for controlling the timing of the counting phase; and transmitting the state control signal to the controller to indicate when the estimate is available.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF THE PRESENT EMBODIMENTS

While embodiments of the present disclosure will be described in relation with an FLL based on the "backward Euler" control technique, it will be apparent to those skilled in the art that the principles described herein can be applied to any type of FLL having a DCO and feedback path.

Figure 1:
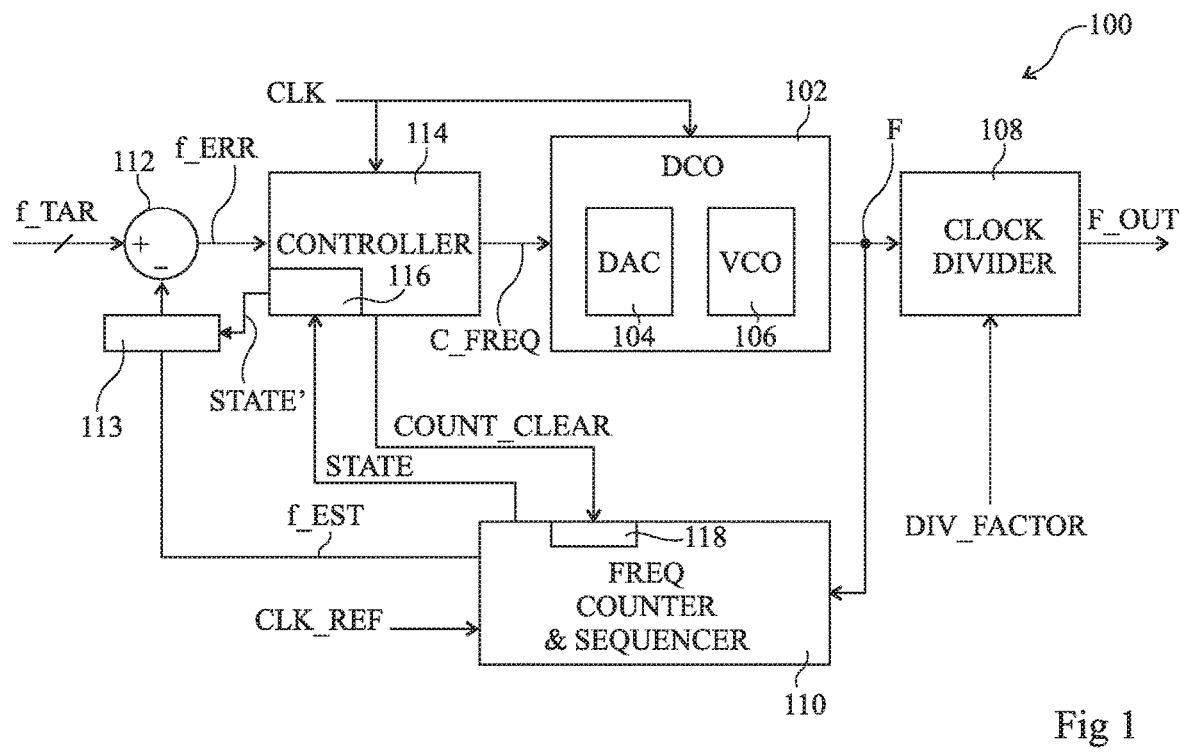
FIG. 1 schematically illustrates an FLL that has been proposed.

FIG. 1 schematically illustrates an FLL 100 based on the "backward Euler" control technique. The circuit comprises a digitally controlled oscillator (DCO) 102, which for example comprises a digital to analogue converter (DAC) 104 and a voltage controlled oscillator (VCO) 106. The DCO 102 outputs a frequency signal F, which is for example provided to a clock divider (CLOCK DIVIDER) 108. The clock divider 108 receives, at a further input, a division factor DIV_FACTOR, indicating a desired ratio between the frequency signal and the output frequency signal F_OUT of the circuit.

The frequency signal F is also provided to a frequency counter and sequencer (FREQ COUNTER & SEQUENCER) 110, which receives a reference clock signal CLK_REF, and estimates the frequency of the frequency signal and provides this estimate f_EST to a subtractor 112 via a register 113. The subtractor 112 also receives a target frequency f_TAR, and generates an error signal f_ERR based on the difference between the estimated frequency f_EST and the target frequency f_TAR. The error signal f_ERR is provided to a controller (CONTROLLER) 114. The controller 114 generates, based on the error signal f_ERR, a digital frequency control signal C_FREQ, which is provided to the DCO 102 in order to adjust the frequency of the frequency signal F. In particular, the DAC 104 of the DCO 102 for example converts the digital frequency control signal C_FREQ into an analog voltage level, which is used to control the oscillation frequency of the VCO 106.

The controller 114 and DCO 102 are for example clocked by a clock signal CLK. The frequency of this clock signal CLK is for example variable under different operating modes of the FLL 100, and in particular may for example be reduced in a low power operating mode of the circuit. Furthermore, as will be described in more detail below, the controller 114 and DCO 102 for example operate within the synchronous clock domain of the clock signal CLK, whereas the frequency counter and sequencer circuit 110 for example operates within the synchronous clock domain of the clock signal CLK_REF. The clocks CLK and CLK_REF are for example derived from different sources. In one example, the clock signal CLK is equal to or derived from the signal F_OUT, and the clock signal CLK_REF is a relatively precise timing signal, provided for example by a crystal oscillator or the like.

The controller 114 for example receives, from the frequency counter and sequencer circuit 110, a signal STATE indicating when a count phase of the frequency counter has been completed and the estimate f_EST is available. The signal STATE is for example resynchronized with the clock signal CLK by a resynchronization circuit 116 of the controller 114. The resynchronized signal STATE' is for example used to clock the register 113.

The frequency counter and sequencer circuit 110 for example receives from the controller 114 a signal COUNT_CLEAR indicating when the frequency counter should be reset. This signal is for example resynchronized with the clock domain CLK_REF by a resynchronization circuit 118.

Operation of the FLL of FIG. 1 will now be described in more detail with reference to FIG. 2.

Figure 2:
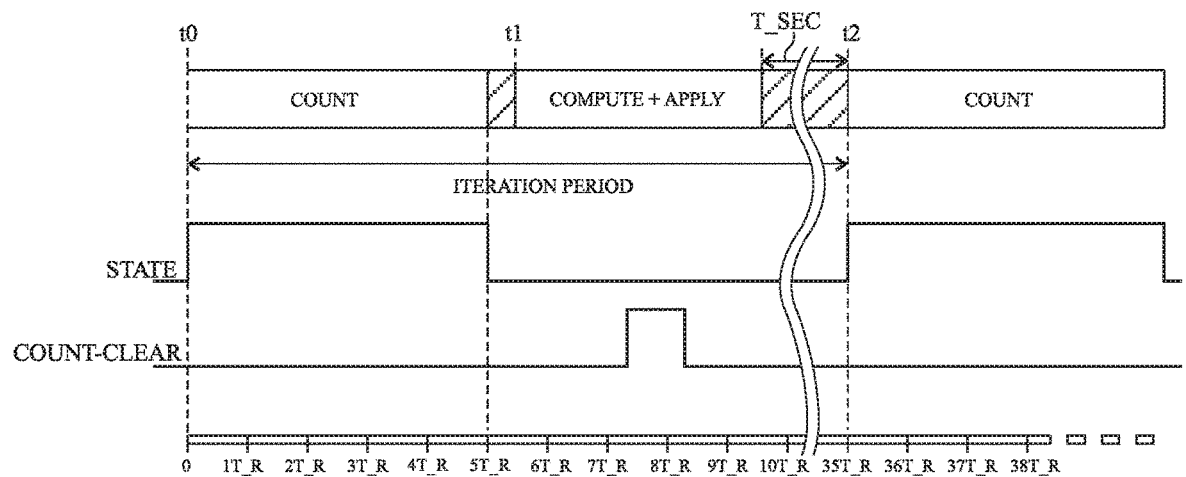
FIG. 2 is a timing diagram representing an iteration period of the FLL of FIG. 1 according to an example embodiment.

FIG. 2 is a timing diagram representing counting and computing phases of the FLL of FIG. 1, and also illustrates examples of the signals STATE and COUNT_CLEAR.

An iteration period (ITERATION PERIOD) of the FLL starts at the time t0 with a counting phase COUNT, during which the signal STATE is high, and the frequency counter 110 counts periods of the frequency signal F during one or more periods of the reference clock signal CLK_REF in order to estimate the frequency. In the example of FIG. 2, this phase has a duration of 5 periods T_R of the reference clock signal CLK_REF.

At the end of the counting phase, the signal STATE for example goes low, signaling to the controller 114 the end of the count phase, and permitting the result f_EST to be clocked by the register 113 after resynchronization of the signal STATE with the clock signal CLK.

The resynchronized STATE signal is also for example used to trigger the start, at a time t1, of the computing phase (COMPUTE+APPLY). The computing phase involves the computation of the subtraction by the subtractor 112, the generation and application of the new control signal C_FREQ to the DCO 102, and the clearing of the frequency counter of the frequency counter and sequencer circuit 110 using the signal COUNT_CLEAR. This computing phase is timed based on the clock signal CLK.

In the example of FIG. 2, the compute phase has a duration of around four periods T_R of the reference clock signal CLK_REF. However, this duration may vary depending on the frequency of the clock signal CLK, and the ratio between the frequency of the clock signal CLK and the frequency of the reference clock signal CLK_REF. Therefore, before a subsequent counting phase can commence at a time t2, a security margin T_SEC is added, which has a significant duration with respect to the minimum durations of the counting and computing phases. In the example of FIG. 2, the security margin is equal to over 25 periods of the reference clock signal CLK_REF, leading to an increase in the duration of the iteration period by a factor of between 2 and 3.

The speed at which the frequency signal F reaches the target level based on the target frequency signal f_TAR is a direct function of the duration of each iteration period. Therefore, in the FLL of FIG. 1, the iteration period will be relatively long, irrespectively of the given setting of the clock frequency.

Figure 3A:
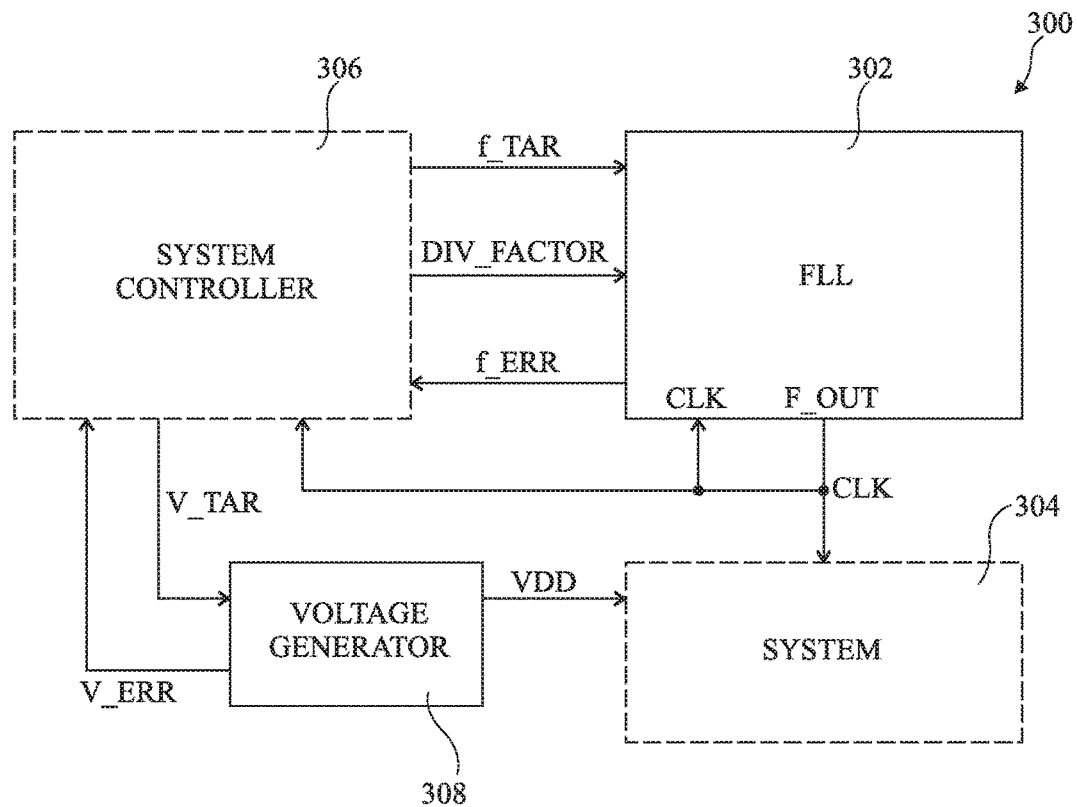
FIG. 3A schematically illustrates a device comprising an FLL according to an example embodiment of the present disclosure.

FIG. 3A schematically illustrates a device 300 comprising an FLL 302 according to an example embodiment of the present disclosure. The FLL 302 for example has similarities with the FFL 100 of FIG. 1, and generates an output signal F_OUT forming a clock signal CLK for a system (SYSTEM) 304. A system controller (SYSTEM CONTROLLER) 306 for example provides the FLL 302 with the signal f_TAR indicating the target frequency of the FLL, and also the signal DIV_FACTOR indicating the desired ratio between a frequency signal generated within the FLL and the output frequency signal F_OUT of the FLL 302. The system controller 306 for example receives the frequency error signal f_ERR from the FLL 302.

In the example of FIG. 3A, at least part of the FLL 302 is clocked by the signal CLK generated by the FLL 302. Furthermore, the system controller 306 is also for example clocked by the clock signal CLK.

In some embodiments, the system controller 306 also controls a voltage generator (VOLTAGE GENERATOR) 308, which provides a supply voltage VDD to the system 304. For example, the system controller 306 provides a target voltage level V_TAR to the voltage generator 308, and receives from the voltage generator 308 an error signal V_ERR indicating a difference between the target level V_TAR and the voltage VDD.

The system controller 306 is for example responsible for modifying the operating frequency and voltage supply of the system 304 in order to achieve a desired performance and power consumption. The voltage level VDD is for example controlled to be high enough at any given time to meet the timing constraints resulting from the clock frequency of the clock signal CLK. Thus the system controller 306 is for example capable of rapidly adjusting the clock frequency of the clock signal CLK by changing the target frequency f_TAR and/or division factor DIV_FACTOR.

Figure 3B:
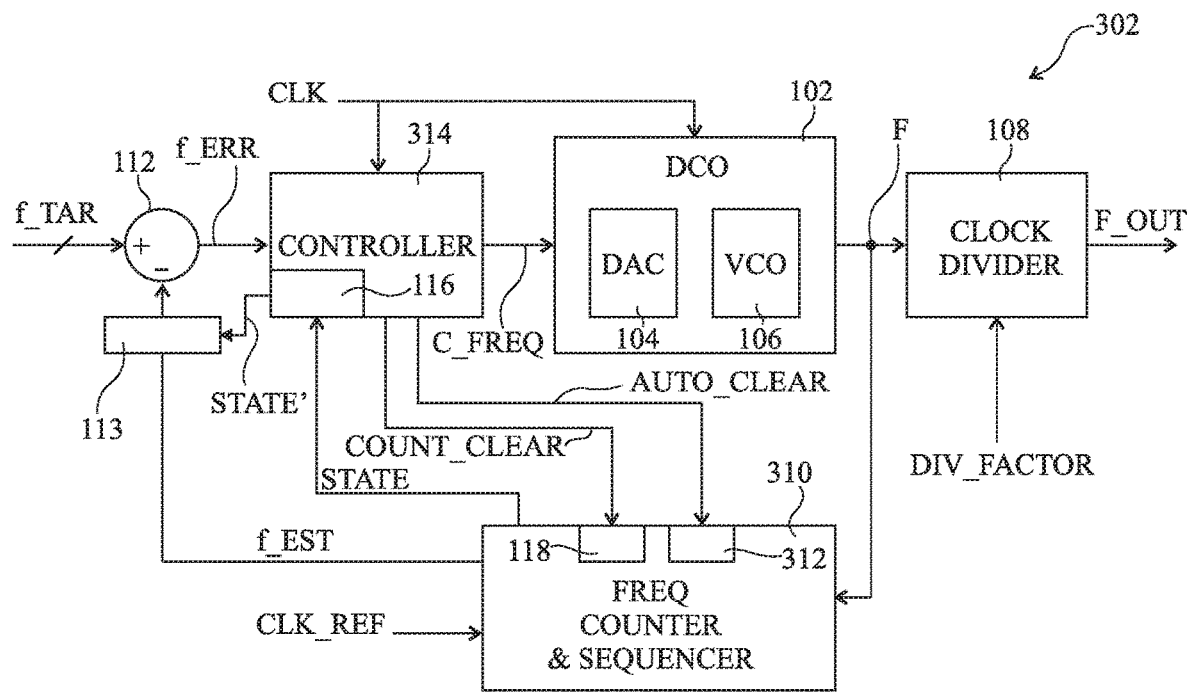
FIG. 3B schematically illustrates a frequency locked loop according to an example embodiment of the present disclosure.

FIG. 3B schematically illustrates a frequency locked loop according to an example embodiment of the present disclosure. For example, the FLL of FIG. 3B implements the FLL 302 of FIG. 3A, although the FLL of FIG. 3B could have other applications. Some features in FIG. 3B are the same as corresponding features in the circuit of FIG. 1, and these elements have been labelled with like reference numerals and will not be described again in detail.

The FLL 300 of FIG. 3B for example comprises a frequency counter and sequencer circuit (FREQ COUNTER & SEQUENCER) 310 replacing the frequency counter and sequencer circuit 110 of FIG. 1, and a controller (CONTROLLER) 314 replacing the controller 114 of FIG. 1. Like the frequency counter and sequencer circuit 110, the frequency counter and sequencer circuit 310 is for example clocked by the reference clock signal CLK_REF and the controller 314 and DCO 102 of FIG. 3B are clocked by the clock signal CLK. The reference clock signal CLK_REF is for example a relatively precise timing signal, provided for example by a crystal oscillator or the like. The clock signal CLK is for example the same clock as the one used to generate the signal f_TAR at the input of the FLL 302, meaning that no resynchronization is for example performed, such as between the system controller 306 and the controller 314, and the operations of these elements can be tightly coupled with each other with relatively low communication latency. This is advantageous, as it implies that the control signal f_TAR, and the error signal f_ERR, can be communicated rapidly between the system controller 306 and the controller 314. Thus the system controller 306 is capable of rapidly controlling the FLL 302 as a function of system constraints such as frequency changes, frequency and voltage changes, IR-drops, etc.

The reference clock signal CLK_REF for example has a frequency in the range 2 kHz to 200 MHz. The clock signal CLK for example has a frequency of between 5 MHz and 1 GHz. The frequency of the clock signal CLK is variable, and is for example capable of being set to one or more frequency values in the range 300 to 900 MHz.

As with the frequency counter and sequencer circuit 110, the frequency counter and sequencer circuit 310 for example estimates the frequency of the frequency signal F at the output of the DCO 102 based on the reference clock signal CLK_REF. For example, the frequency counter counts periods of the clock signal F during one or more whole periods of the reference clock signal CLK_REF. Indeed, advantageously, the time interval of the counting phase, and in particular the start and end times, is set directly by transitions of the reference clock signal CLK_REF, and not by another source such as the controller 314. This leads to a relatively high precision of the count value.

The frequency counter and sequencer circuit 310 is for example capable of determining a ratio between the frequencies of the reference clock signal CLK_REF and the frequency signal F. Knowing the frequency of the reference clock signal CLK_REF, the frequency counter and sequencer circuit 310 is thereby able to estimate the frequency f_EST of the frequency signal F. Alternatively, the signal f_EST may simply be the count value of the counter corresponding to the number of periods of the frequency signal F during one or more periods of the reference clock signal CLK_REF. The target frequency f_TAR is then for example expressed as a desired ratio between the frequency of the reference clock CLK_REF and the frequency of the frequency signal F.

The signals STATE and COUNT_CLEAR are for example transmitted between the frequency counter and sequencer circuit 310 and the controller 314 like in the example of FIG. 1.

Additionally, the controller 314 of FIG. 3B is for example adapted to generate a trigger signal AUTO_CLEAR, which is provided to the frequency counter and sequencer circuit 310. The frequency counter and sequencer circuit 310 for example comprises a resynchronization circuit 312, which receives the trigger signal, and generates an internal signal, resynchronized with the reference clock signal CLK_REF, for triggering the end of the computing phase and in some cases also the start of the counting phase. This means that, rather than the computing phase continuing for a fixed number of periods of the reference clock signal CLK_REF, it is ended earlier by the trigger signal, allowing a new counting phase to start.

The trigger signal AUTO_CLEAR is for example generated by the controller 314 based on when it has finished its computing operation. For example, the trigger signal is asserted at a given time with respect to the timing of a transition of the control signal C_FREQ to a new value. For example, in some embodiments, the trigger signal AUTO_CLEAR is asserted on a same edge of the clock signal CLK as the one on which the signal C_FREQ transitions. Alternatively, the signal AUTO_CLEAR may be asserted after a delay of one or more clock periods from the time that the signal C_FREQ transitions in order to allow time for the frequency of the frequency signal F to adjust based on the new value of C_FREQ.

Whereas the frequency counter and sequencer circuit 110 of FIG. 1 is configured to time the start a new counting phase based on a fixed number of clock periods of the reference clock signal CLK_REF, the frequency counter 310 starts a new counting phase based on the trigger signal AUTO_CLEAR, which for at least some frequencies of the variable clock signal CLK will allow the counting phase to be triggered early, thereby reducing the iteration period.

Figure 3C:
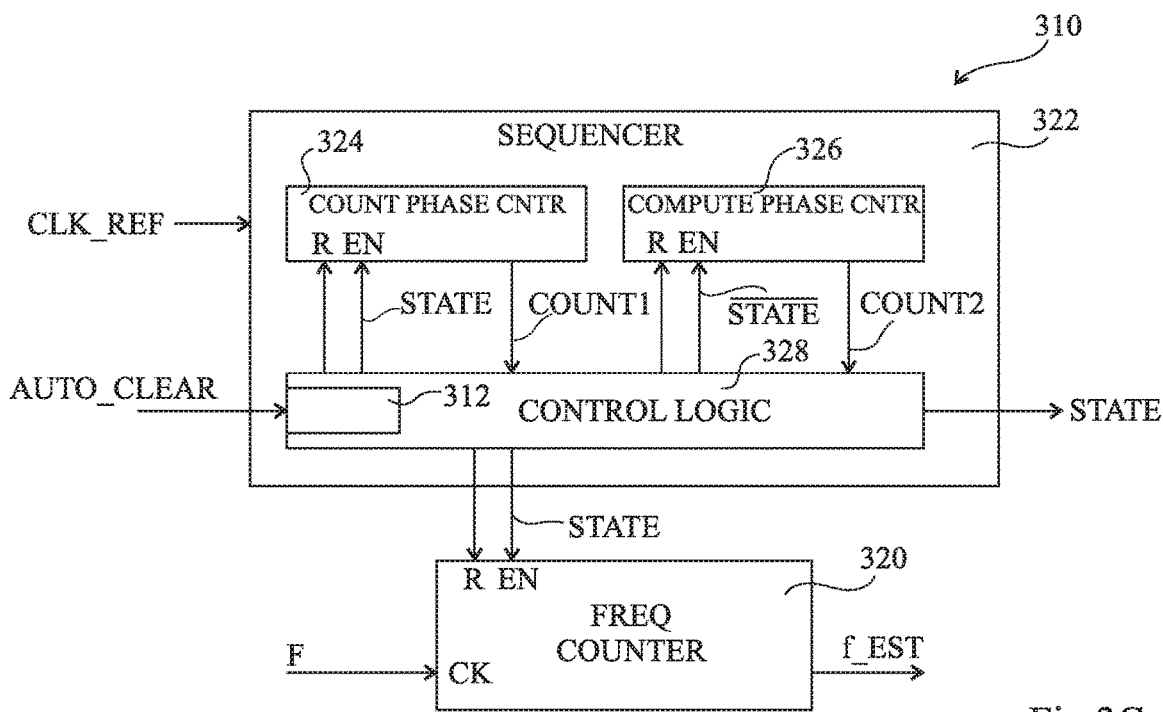
FIG. 3C schematically illustrates a frequency counter and sequencer of FIG. 3B in more detail according to an example embodiment of the present disclosure.

FIG. 3C schematically illustrates the frequency counter and sequencer circuit 310 of FIG. 3B in more detail according to an example embodiment.

A frequency counter (FREQ COUNTER) 320 is for example clocked by the frequency signal F, and receives at its enable input the STATE signal. It provides at its output the signal f_EST.

The frequency counter and sequencer circuit 310 further comprises a sequencer 322, which for example comprises a counter (COUNT PHASE CNTR) 324 for defining the time interval of the count phase, a further counter (COMPUTE PHASE CNTR) 326 for defining a maximum duration of the compute phase, and control logic (CONTROL LOGIC) 328. The control logic 328 for example comprises the resynchronization circuit 312 receiving the signal AUTO_CLEAR. The control logic 328 for example generates the signal STATE, and provides this signal to the controller 314 and also to enable inputs of the counters 320 and 324, and the inverse of this signal to the enable input of the counter 326. The control logic 328 also for example provides reset signals to corresponding reset inputs of the counters 320, 324 and 326 for clearing the count values. The counters 324 and 326 are for example clocked by the reference clock signal CLK_REF. Count values COUNT1 and COUNT2 generated by the counters 324 and 326 respectively are for example provided to the control logic 328.

While not illustrated in FIG. 3C, the control logic 328 also for example comprises the resynchronization circuit 118 receiving the signal COUNT_CLEAR from the controller 314.

Operation of the control logic 328 will now be described in more detail with reference to FIG. 3D.

Figure 3D:
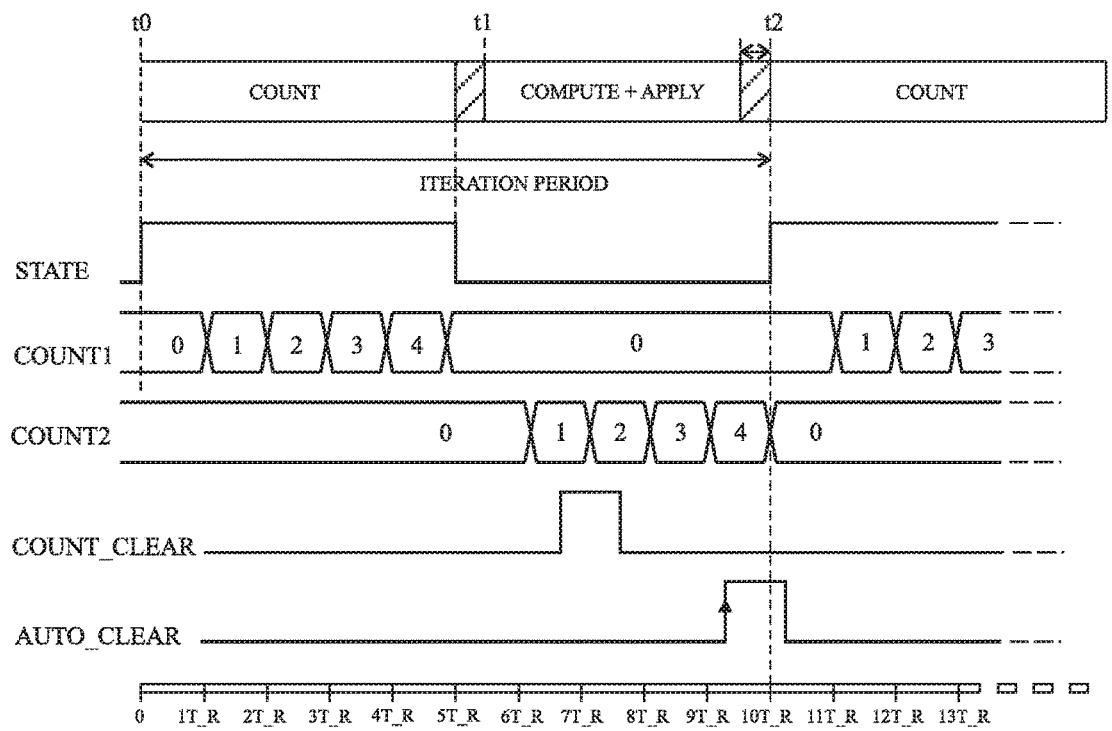
FIG. 3D is a timing diagram representing an iteration period of the FLL of FIG. 2 according to an example embodiment of the present disclosure.

FIG. 3D is a timing diagram representing counting and computing phases of the FLL of FIG. 3B, and also illustrating examples of the signals STATE, COUNT1, COUNT2, COUNT_CLEAR and AUTO_CLEAR.

During the count phase, the control logic 328 for example brings the signal STATE high, causing the counters 320 and 324 to start counting. When the signal COUNT1 reaches a given value, equal for example to 4 in the example of FIG. 3D corresponding to 5 periods of the reference clock signal, the control logic 328 changes the state to start the compute phase, for example by bringing the signals STATE low such that the counters 320 and 324 stop counting, and the counter 326 starts counting.

While not illustrated in the figures, in some embodiments the duration of the count phase is programmable by the controller 314 and/or by the system controller 306, for example by a control signal provided to a corresponding resynchronization circuit of the control logic 328.

During the compute phase, the controller 314 for example asserts the signal COUNT_CLEAR in order to reset the counter 320. An advantage of resetting the counter 320 before the end of the compute phase is that the delay of this operation does not add to the iteration period. It would however also be possible to omit the COUNT_CLEAR signal, and to both reset the counter 320 and enable it in response to the AUTO_CLEAR signal.

As previously mentioned, the controller 314 for example asserts the signal AUTO_CLEAR based on the time it finishes its computation. This signal is for example resynchronized with the reference clock signal CLK_REF by the circuit 312, and causes the control logic 328 to switch back to the count phase by asserting again the STATE signal, and resetting the counter 326. The counter 326 is for example used only in the absence of the AUTO_CLEAR signal in order to impose a maximum duration of the compute phase.

Figure 4:
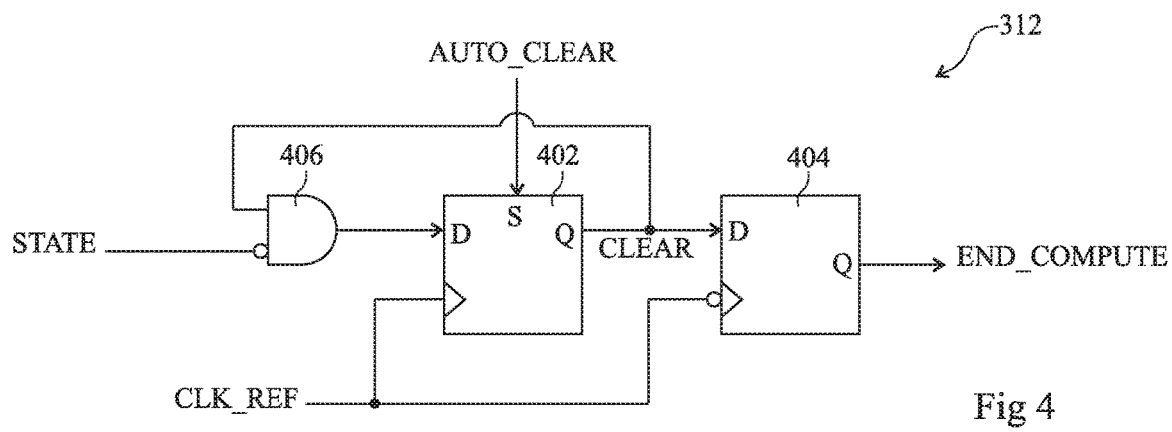
FIG. 4 schematically illustrates the sequencer of the FLL of FIG. 3B in more detail according to an example embodiment.

FIG. 4 schematically illustrates the resynchronization circuit 312 of the frequency counter and sequencer circuit 310 of FIG. 3B in more detail according to an example embodiment. The circuit 312 for example comprises a flip-flop 402, which is for example a flip-flop with an asynchronous "set" pin S, and a further flip-flop 404. The flip-flop 402 is for example clocked by the reference clock signal CLK_REF, and the flip-flop 404 is for example clocked by the inverse of the reference clock signal CLK_REF. The flip-flop 402 receives at its set input S the trigger signal AUTO_CLEAR from the controller 314. The flip-flop 402 provides, on an output line, an output signal CLEAR to a data input of the flip-flop 404. The resynchronization circuit 312 also for example comprises an AND gate 406 having an inverted input and a non-inverted input. The output line of the flip-flop 402 is also coupled to the non-inverted input of the AND gate 406. The inverted input of the AND gate 406 for example receives a state signal STATE. The output of the AND gate 406 is for example coupled to the data input of the flip-flop 402.

The flip-flip 404 generates an output signal END_COMPUTE that triggers the start of a new counting phase.

The state signal STATE for example indicates a current state of the FLL 300, and in particular whether it is in the counting phase or computing phase.

Figure 5:
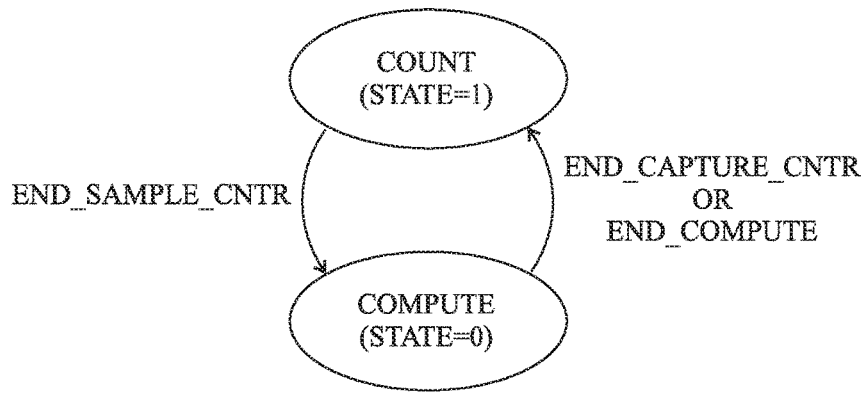
FIG. 5 is a state diagram illustrating states of the sequencer of FIG. 3B according to an example embodiment.

FIG. 5 is a state diagram showing the state transitions of the FLL 300 of FIG. 3B according to an example embodiment. During the counting phase, the FLL 300 is in a COUNT state, and the signal STATE is for example at a logic "1". The frequency counter and sequencer circuit 310, and in particular the counter 324, for example generates a signal END_SAMPLE_CNTR when the counting phase is complete and the frequency estimation f_EST is available, this signal corresponding to the level of the count value COUNT1 at the end of the count phase. When the signal END_SAMPLE_CNTR is activated, the state for example transitions to the computing state COMPUTE, in which the state signal STATE is for example at a logic "0". In this state, the controller 314 is for example adapted to update the digital control signal C_FREQ based on the frequency error signal f_ERR, and applies this signal to the DCO 102 in order to bring about a modification of the frequency signal F. Once the digital control signal C_FREQ has been applied, the controller 314 for example asserts the signal AUTO_CLEAR, which in turn causes the signal END_COMPUTE to be asserted, causing the state to return to the COUNT state, and triggering a new counting phase. As mentioned above, the return to the COUNT state can also be triggered by the counter 326 that indicates when the computing phase is complete by asserting a signal END_CAPTURE_CNTR corresponding to the count value COUNT2 when the maximum duration has been reached. This maximum count is for example similar to the one that is systematically applied by the frequency counter and sequencer circuit 110 of FIG. 1.

Figure 6:
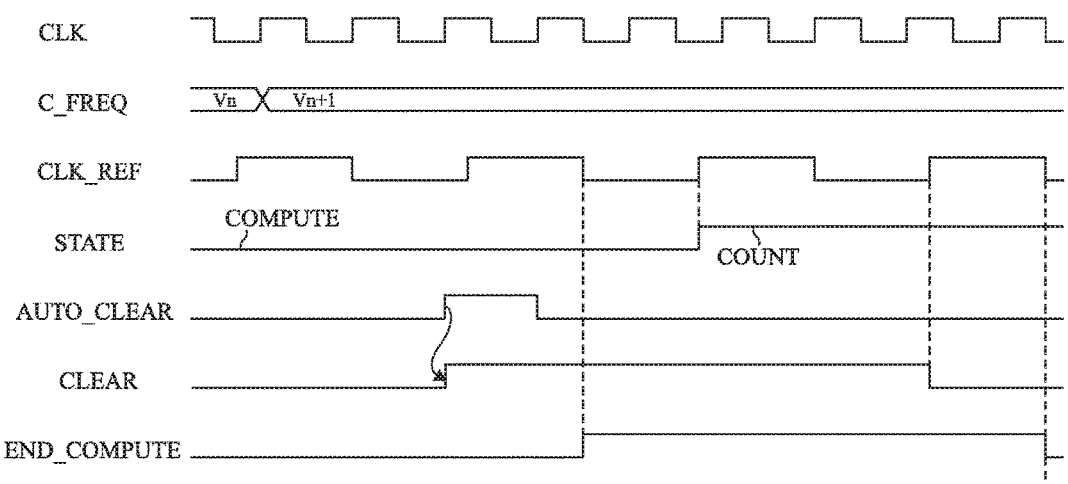
FIG. 6 is a timing diagram illustrating signals in the sequencer of FIG. 4 according to an example embodiment.

FIG. 6 is a timing diagram illustrating examples of the clock signals CLK and C_FREQ of the controller 314 and of the signals CLK_REF, STATE, AUTO_CLEAR, CLEAR and END_COMPUTE of the resynchronization circuit 312.

As illustrated, the control signal C_FREQ for example transitions from a current value Vn to a new value Vn+1 on a rising edge of the clock signal CLK. The signal AUTO_CLEAR is for example asserted by the controller 314 shortly thereafter. The signal AUTO_CLEAR is for example asserted one or more clock periods after the transition of the signal C_FREQ to account for the delay for the DCO to modify the frequency signal F. In the example of FIG. 6, this delay is equal to two periods of the clock signal CLK, but of course another delay, or no delay, could be provided. The assertion of the signal AUTO_CLEAR for example causes the signal CLEAR at the output of the flip-flop 402 to go high asynchronously. The signal CLEAR remains high until the rising edge of the signal CLK_REF after the signal STATE transitions to a logic "1".

The signal END_COMPUTE for example goes high on the falling edge of the reference clock signal CLK_REF following the assertion of the signal CLEAR. This in turn causes the signal STATE to flip to a logic "1" at the subsequent rising edge of the reference clock signal CLK_REF. Both of the signals CLEAR and STATE received by the gate 406 being at a logic "1", this gate generates a logic "0" at its output. Therefore, the signal CLEAR falls low at the next rising edge of the reference clock signal CLK_REF. The signal END_COMPUTE likewise falls low at the next falling edge of the reference clock signal CLK_REF.

An advantage of the embodiments described herein is that the trigger signal generated by the controller 314 permits a subsequent count phase to begin earlier, in response to the actual termination time of the computing phase and once the frequency of the frequency signal has settled, rather than waiting for the end of a maximum expected computing phase having a fixed number of clock periods. This enables the iteration period to be reduced at least some of the time, and in particular when the frequency of the clock signal CLK of the controller is higher than its minimum value.

Having thus described at least one illustrative embodiment, various alterations, modifications and improvements will readily occur to those skilled in the art.

For example, while an example of a resynchronization circuit 312 has been described in relation with FIG. 4, it will be apparent to those skilled in the art that there are many alternative configurations that would be possible. For example, the flip-flop 402 with set pin could be replaced by another type of flip-flop, and the flip-flops 402 and 404 could respectively be clocked by falling and rising edges. Similarly, the timing diagrams of FIGS. 3D and 6 represents just one example embodiment, and in alternative embodiments various modifications would be possible, such as inversing the significant edges of the clock signals.

What is claimed is:

1. A device comprising:
a frequency locked loop comprising:
a digitally controlled oscillator (102) configured to generate a frequency signal (F);
a frequency counter and sequencer circuit (310) configured to generate an estimate (f_EST) of the frequency of the frequency signal (F) by counting periods of the frequency signal (F) during a counting phase having a start and an end timed by corresponding transitions of a reference clock signal (CLK_REF), the frequency counter and sequencer circuit (310) being further configured to have a computing phase during which periods of the frequency signal are not counted;
a subtracter (112) configured to generate an error signal (f_ERR) by determining the difference between the estimated frequency (f_EST) and a target frequency (f_TAR); and
a controller (314) configured to generate a digital control signal (C_FREQ) for controlling the digitally controlled oscillator (102) based on the error signal, wherein the controller (314) is clocked by a further clock signal (CLK), different from the reference clock signal, the further clock signal having a variable frequency, and the controller (314) configured to generate and provide to the frequency counter and sequencer circuit (310) a trigger signal (AUTO_CLEAR) for triggering, after resynchronization of the trigger signal with the reference clock signal (CLK_REF), the end of the computing phase, wherein the frequency counter and sequencer circuit (310) further comprises a resynchronization circuit (312) configured to synchronize the trigger signal (AUTO_CLEAR) with the reference clock signal (CLK_REF).

2. The device of claim 1, wherein the resynchronization circuit (312) comprises first and second flip-flops (402, 404) each clocked by the reference clock signal (CLK_REF), the first flip-flop (402) receiving the trigger signal (AUTO_CLEAR), and the second flip-flop (404) outputting a resynchronized trigger signal (END_COMPUTE).

3. The device of claim 1, wherein the frequency counter and sequencer circuit comprises a sequencer (322) configured to generate a state control signal (STATE) for controlling the timing of the counting and computing phases, the sequencer (322) being configured to transmit the state control signal (STATE) to the controller (314) to indicate when the estimate (f_EST) is available.

4. The device of claim 1, wherein the controller (314) is further configured to generate a further control signal (COUNT_CLEAR) for resetting the frequency counter and sequencer circuit (310).

5. The device of claim 1, wherein the digitally controlled oscillator (102) comprises a digital to analog converter (104) and a voltage controlled oscillator (106).

6. The device of claim 1, wherein the further clock signal (CLK) has a variable frequency that can be set to any of a plurality of frequency values.

7. The device of claim 1, wherein the trigger signal (AUTO_CLEAR) is asserted at a fixed time interval with respect to a transition of the digital control signal (C_FREQ).

8. The device of claim 7, wherein the fixed time interval is equal to a time delay of one or more clock periods for at least partially compensating for a time delay of the digitally controlled oscillator.

9. The device of claim 1 further comprising:
a system controller (106) configured to control the frequency of the frequency signal, wherein the system controller (306) and the controller (314) are both clocked by said further clock signal.

10. The device of claim 9, wherein the further clock signal is equal to or derived from said frequency signal (F).

11. A method comprising:
generating a frequency signal using a frequency locked loop by:
generating a frequency signal (F) using a digitally controlled oscillator (102);
generating, by a frequency counter and sequencer circuit (310), an estimate (f_EST) of the frequency of the frequency signal (F) by counting periods of the frequency signal (F) during a counting phase having a start and an end timed by corresponding transitions of a reference clock signal (CLK_REF), the frequency counter and sequencer circuit (310) also having a computing phase during which periods of the frequency signal are not counted;
generating, by a subtracter (112), an error signal (f_ERR) by determining the difference between the estimated frequency (f_EST) and a target frequency (f_TAR);
generating, by a controller (314), a digital control signal (C_FREQ) for controlling the digitally controlled oscillator (102) based on the error signal, wherein the controller (314) is clocked by a further clock signal (CLK), different from the reference clock signal, the further clock signal having a variable frequency;
generating, and providing to the frequency counter and sequencer circuit (310), by the controller (314), a trigger signal (AUTO_CLEAR) for triggering, after resynchronization of the trigger signal with the reference clock signal (CLK_REF), the end of the computing phase; and
synchronizing, by a resynchronization circuit (312) of the frequency counter and sequencer circuit (310), the trigger signal (AUTO_CLEAR) with the reference clock signal (CLK_REF).

12. The method of claim 11, further comprising:
generating, by a sequencer (322) of the frequency counter and sequencer circuit (310), a state control signal (STATE) for controlling the timing of the counting phase; and
transmitting the state control signal (STATE) to the controller 314) to indicate when the estimate (f_EST) is available.

13. A frequency locked loop comprising:
a digitally controlled oscillator (102) configured to generate a frequency signal (F);
a frequency counter and sequencer circuit (310) configured to generate an estimate (f_EST) of the frequency of the frequency signal (F) by counting periods of the frequency signal (F) during a counting phase having a start and an end timed by corresponding transitions of a reference clock signal (CLK_REF), the frequency counter and sequencer circuit (310) being further configured to have a computing phase during which periods of the frequency signal are not counted, the frequency counter and sequencer circuit (310) further comprising a resynchronization circuit (312) configured to synchronize the trigger signal (AUTO_CLEAR) with the reference clock signal (CLK_REF), the resynchronization circuit (312) comprising first and second flip-flops (402, 404) each clocked by the reference clock signal (CLK_REF), the first flip-flop (402) receiving the trigger signal (AUTO_CLEAR), and the second flip-flop (404) outputting a resynchronized trigger signal (END_COMPUTE), and
a controller (314) configured to generate a digital control signal (C_FREQ) for controlling the digitally controlled oscillator (102) based on the estimated frequency (f_EST), wherein the controller (314) is clocked by a further clock signal (CLK) having a variable frequency, and the controller (314) is configured to generate a trigger signal (AUTO_CLEAR) for triggering, after resynchronization of the trigger signal with the reference clock signal (CLK_REF), the end of the computing phase.

* * * * *